United States Patent [19]
Fenoglio et al.

[11] Patent Number: 5,003,037
[45] Date of Patent: Mar. 26, 1991

[54] POLYAMIDE, POLYIMIDE, AND POLYAMIDE-IMIDE POLYMERS AND COPOLYMERS USING 3,5-DIAMINO-T-BUTYLBENZENE

[75] Inventors: David J. Fenoglio, Wheaton; Douglas E. Fjare; Edwin F. Morello, both of Naperville; Neal B. Nowicki, St. Charles, all of Ill.

[73] Assignee: Amoco Corporation, Chicago, Ill.

[21] Appl. No.: 562,621

[22] Filed: Aug. 3, 1990

Related U.S. Application Data

[60] Division of Ser. No. 509,165, Apr. 16, 1990, which is a division of Ser. No. 212,510, Jun. 28, 1988, Pat. No. 4,946,834, which is a continuation-in-part of Ser. No. 277,756, Nov. 30, 1988.

[51] Int. Cl.$^5$ .............................................. C08G 73/10
[52] U.S. Cl. ................................... 528/350; 528/208; 528/344; 528/348; 528/349; 528/353
[58] Field of Search ............... 528/350, 208, 353, 344, 528/348, 349

[56] References Cited

U.S. PATENT DOCUMENTS 4,245,066  1/1981  Nakagawa et al. .................. 525/432
4,885,356 12/1989  Milligan et al. ...................... 528/349

Primary Examiner—Morton Foelak
Attorney, Agent, or Firm—Reed F. Riley; William H. Magidson; Ralph C. Medhurst

[57] ABSTRACT

Soluble, film-forming, polyamides, polyimides, and polyamide-imides and their copolymers made using 3,5-diamino-t-butylbenzene are described. These polymers have some solubility in organic solvents such as N-methylpyrrolidone, a high Tg, excellent thermal stability, lower density and lower moisture uptake and are useful in films, fibers and composites, and in the electronics industry as electrical component substrates, protective coatings, interlevel dielectrics and the like.

2 Claims, No Drawings

POLYAMIDE, POLYIMIDE, AND POLYAMIDE-IMIDE POLYMERS AND COPOLYMERS USING 3, 5-DIAMINO-T-BUTYLBENZENE

This is a division of application Ser. No. 509,165 filed Apr. 16, 1990 which in turn is a divisional of Ser. No. 212,510, filed June 28, 1988, now U.S. Pat. No. 4,946,934, which in turn is a CIP of 277,756 filed Nov. 30, 1988.

BACKGROUND OF THE INVENTION

This invention relates to soluble, film-forming polyamides, polyimides and polyamide-imides and their copolymers made using 3,5-diamino-t-butylbenzene, and, more particularly, to partially soluble, high Tg, high thermal stability, lower density, lower-moisture-uptake polyamides, polyimides and polyamide-imides and their copolymers made using 3,5-diamino-t-butylbenzene.

Aromatic polyamides, polyimides and polyamide-imides have found extensive use in industry as fibers, composites, molded parts and dielectrics due to their toughness, flexibility, mechanical strength and high thermal stability, and, in the case of polyimides, their lower dielectric constant and high electrical resistivity. Such polymers have been used in both film and coating form as advanced materials for such uses as passivation and insulating coatings, interlevel dielectrics, die attach adhesives, flexible circuit substrates, and the like.

Although current polyamides, polyimides, and polyamide-imides made from, for instance, metaphenylenediamine have the toughness, flexibility and thermal stability necessary to meet the rigorous processing and operating conditions required for certain uses, they do not exhibit the low dielectric constant and reduced moisture uptake shown by lower thermal stability polymers such as polyethylene and polytetrafluoroethylene. The latter polymers, however, are not useful despite their excellent dielectric and moisture uptake properties if thermal stability requirements are demanding. In addition, polyamides, polyamide-imides and particularly polyimides are generally insoluble even in solvents like N-methyl pyrrolidone (NMP) or dimethyl acetamide (DMAC) which inhibits their usefulness in important areas.

Now it has been found that improved polymers exhibiting the combination of low dielectric constant, lower moisture uptake, partial solubility in N-methylpyrrolidone, lower density, and thermal stability can be found among the polyamides, polyimides, and polyamide-imides and their copolymers made from 3,5-diamino-t-butylbenzene.

SUMMARY OF THE INVENTION

In one aspect, the invention contained herein is directed to an at least partially soluble, film-forming, polyamide, polyimide, or polyamide-imide, or a copolymer thereof, made from 3,5-diamino-t-butylbenzene. In another aspect, the invention is directed to an at least partially soluble, film-forming polyamide or copolyamide made from 3,5-diamino-t-butylbenzene and a compound selected from the group consisting of organic diacids, diesters and diacyl chlorides. In a third aspect, the invention is directed to an at least partially soluble, film-forming polyimide or copolyimide made from 3,5-diamino-t-butylbenzene and a compound selected from the group consisting of aromatic dianhydrides and their corresponding acids and esters. In yet another aspect, the invention is directed to an at least partially soluble, film-forming aromatic polyamide-imide or copolyamide-imide made from 3,5-diamino-t-butylbenzene and the acyl chloride derivative of trimellitic acid anhydride.

DETAILED DESCRIPTION OF THE INVENTION

The polyamides, polyimides, and polyamide-imides, and their copolymers, of this invention have high Tg, preferably above about 300° C., high temperature of onset of degradation in nitrogen, preferably above about 450° C., at least partial solubility in organic solvents, preferably at least about fifteen weight percent in N-methylpyrrolidone for the polyamides, preferably at least about ten weight percent in N-methylpyrrolidone for the polyamide-imides, and preferably at least about 1 weight percent in N-methylpyrrolidone for the polyimides. They also have lower density, preferably at least less than 1.3 g/cc, and lower uptake of moisture at 100% relative humidity (R.H.), preferably less than about two weight percent for the polyimides, preferably less than about five weight percent for the polyamide-imides, and preferably less than about eight weight percent for the polyamides.

These polyamides, polyimides, and polyamide-imides, and their copolymers, are made from 3,5-diamino-t-butylbenzene (DATB) and a compound which is a diacid, diester or diacyl chloride (polyamides), a dianhydride or its acid or ester derivative (polyimides), and the acyl chloride derivative of trimellitic acid anhydride (polyamide-imides). More preferably, the polyamide or copolyamide is made from DATB and the diacyl chloride of benzene, t-butylbenzene, biphenyl, diphenylether, and naphthalene. When the polymer is a polyimide or copolyimide the preferred compound is an aromatic dianhydride such as the dianhydride of benzene (PMDA), biphenyl (BPDA), diphenylether (OPAN), naphthalene or 2,2-bis(3,4-dicarboxyphenyl)-propane dianhydride (IPAN), or 2,2-bis(3,4-dicarboxyphenyl)hexafluoropropane dianhydride (6FDA). Preferred polyamide-imides and copolyamide-imides are made using the acyl chloride of trimellitic acid anhydride (TMAC).

The polymers of this invention are made by dissolving an aromatic diamine, preferably polymer grade diamine, in a solvent such as N-methylpyrrolidone or dimethylacetamide and adding the acidic compound at a temperature between about 0° C. and 100° C. to make a solution of the polymer. Desirably, solutions of the polymer from about 5 to about 50 weight percent, more preferably, about 10 to about 20 weight percent are employed. In general, roughly equal molar portions of the diamine and the acid component are used in making the polymer solutions, although a small excess of one or the other component can be used in order to terminate the polymer with either acidic or amine groups to control molecular weight.

The resulting solution of polymer can be spread on a substrate, and the solvent evaporated leaving the polymer in the form of a layer or coating. The coating or film in the case of a polyimide is then heated, preferably in an inert gas such as nitrogen to complete the imidization process. Films and coatings of the polymers are desirably thin, preferably between about one and about twenty microns in thickness, more preferably between about one and about ten microns.

The polymers of this invention are useful as fibers, composites and the like, and both free-standing films and coatings can be made in the form of flexible substrates for electrical components, interlevel dielectrics, passivation etc.

The following Examples will serve to illustrate certain embodiments of the herein disclosed invention. These Examples should not, however, be construed as limiting the scope of the novel invention as there are many variations which may be made thereon without departing from the spirit of the disclosed invention, as those of skill in the art will recognize.

EXAMPLES

General

All percents used are weight percents. Test procedures used to characterize the polymers of this invention are are follows:

Dielectric Constant

Dielectric constant measurements were made on thin films (0.7 to 2.0 mils thick) cast from polymer solutions onto glass plates and thermally cured. The measurements were made using a two-fluid cell technique as described in ASTM D 150. The reproducibility of the dielectric constant measurement using this technique is about 2 percent of the measured value.

Films were dried and stored in a nitrogen-purged dry box prior to testing at 1 MHz to give results at 0% relative humidity.

Moisture Absorption and Change in Dielectric Constant at 40% R.H.

Moisture absorption measurements were made on waferlevel capacitor structures. Three-layer structures of aluminum/polymer/aluminum were fabricated on silicon wafers as set forth in U.S. Ser. No. 212,511, filed on June 26, 1988. Aluminum thickness was 0.6 microns, polymer thickness was 1 to 2 microns, and capacitor size was 0.01 square centimeters. Capacitance of the structures was measured between 50° C. and 300° C. over a range of frequencies. The capacitors were tested to 300° C., allowed to cool, and immediately reheated to 300° C. The moisture absorption values were calculated based on the difference between the measured 1 MHz dielectric constants at 50° C. for the first and second heats of the test according to the formula:

$$\text{Equilibrium Moisture (100\% R.H.)} = \frac{2\Delta\epsilon}{0.4}$$

formula is based upon 2 percent equilibrium moisture per unit change in epsilon, and where $\Delta\epsilon$ is the change in dielectric constant between first and second heat. The start of the first heat is assumed to be at 40% R.H. as the wafers were allowed to equilibrate for two days at 40% R.H. prior to testing. The start of the second heat is assumed to be approximately 0% R.H. as the wafers were reheated immediately after the water was driven off during the first heat. The change in dielectric constant at 40% R.H. is the percent difference between the measured 1 MHz dielectric constants at 50° C. for the first and second heats of the test.

Glass Transition Temperature (Tg)

The glass transition temperature of the polymers was measured by differential scanning calorimetry. Tg measurements were made on thin film cast from polymer solutions onto glass plates and thermally cured.

Temperature of Onset of Degradation in Air and Nitrogen

The temperature of onset of degradation of the polymers was measured by thermogravimetric analysis. The onset temperature is the temperature at which 1 weight percent weight loss is found at a heating rate of 10° C./min. Measurements were made on thin films cast from polymer solutions onto glass plates and thermally cured.

EXAMPLE 1

In a flame dried two liter 3-necked round bottomed flask equipped with a thermometer-nitrogen inlet tube and stirred was placed 19.68 g (0.12 mol) of 3,5-diamino-t-butylbenzene and 275 g of dimethylacetamide. This was mixed and cooled under nitrogen to 10° C. Solid 5-t-butylisophthaloyl chloride was added with mixing over 30 min while a temperature of no greater than 10° C. was maintained. The mixture was allowed to come to room temperature with mixing and heated to 30°–35° C. for 3 hr. The resulting polymer was precipitated and washed in water. After drying, 41 g (97.6% yield) of a white, powdery solid was obtained. This material has an inherent viscosity of 0.70 in dimethylacetamide (0.4 wt. %) at 30° C. The glass transition temperature was found to be 322° C. as measured by DSC. Thermal gravimetric analysis in nitrogen shows decomposition at 431° C. The density of this polyamide was determined to be 1.078 using density gradient columns.

EXAMPLE 2

In a manner similar to Example 1 above, 16.43 g of 3,5-diamino-t-butylbenzene was reacted with 20.3 g of terephthaloyl dichloride in 100 ml of dimethylacetamide. The resulting polyamide has a I.V. of 1.63. The glass transition temperature of the polymer is 337° C.

EXAMPLE 3

In a manner similar to Example 1, 16.425 grams of 3,5-diamino-t-butylbenzene was reacted with 20.3 grams of isophthaloyl dichloride in 100 ml of dimethylacetamide. The resulting polyamide has an I.V. of 0.55. The glass transition temperature of the polyamide is 300° C.

EXAMPLE 4

To a clean and dry 100 ml reaction kettle were added 5.402 grams of 3,5-diamino-t-butylbenzene (DATB) and 14.611 grams of 2,2-bis(3,4-dicarboxyphenyl)hexafluoropropane dianhydride (6FDA); all operations were performed under a nitrogen atmosphere. To the monomers were added 59.99 grams of N-methylpyrrolidone (NMP) and the resulting mixture was stirred for 17 hours. The resulting polyamic acid solution contained 25% by weight solids and has a IV of 1.06 dL/g at 25° C. The solution was refrigerated until needed.

A film of the 6FDA/DATB polyamic acid was prepared by casting the resin onto a soda-lime glass in a dust-free environment. The polyamic acid film was thermally imidized to the corresponding polyimide film by heating in a forced-air oven for one hour at 80° C., then 200° C., and finally 300° C. The resulting film was removed from the glass plate after cooling to room temperature by soaking in water. The dielectric constant of the dried polyimide film is 2.77 (0% R.H.) at 1 MHz.

EXAMPLE 5

A copolyimide having the composition 1 6FDA: 0.8 DATB: 0.2 APBP was prepared in the following manner. A mixture of 2.028 grams of DATB and 1.135 grams of 4,4'-bis(p-aminophenoxy)biphenyl (APBP) was dissolved in 15.057 grams of NMP and reserved. In a separate kettle, 6.842 grams of 6FDA was dissolved in 34.869 grams of NMP. The mixed diamines solution was added over a period of 30 minutes to the 6FDA solution with stirring. An additional 6.748 grams of NMP were added to the solution. All manipulations were performed under a nitrogen atmosphere. The resulting copolyimide solution was 15.0% solids and showed an I.V. of 0.92 dL/g at 25° C.

EXAMPLE 6

Into a dry flask containing a nitrogen atmosphere were added 28.21 g of dimethylacetamide and 4.14 g of 3,5-diamino-t-butylbenzene. To this stirred solution was added 5.264 g trimellitic anhydride acid chloride while maintaining the temperature between 20 and 30° C. After addition was complete, the solution temperature was maintained at 30° C. for an additional 5 hours. The resulting polymer was precipitated in a high speed blender and washed in distilled water to a pH of 4.5. After air drying, the polymer was vacuum dried at 60° C. to give 8.1 g of a powdery solid in 96% yield. The initial inherent viscosity was 0.167; after curing 30 minutes at 500° F., the inherent viscosity was 0.278 as measured at 25° C. in dry N-methylpyrrolidone with a Cannon-Fenske viscometer at a 0.5 g/100 ml concentration. Tg of the polymer is 331° C. and temperature of onset of degradation under nitrogen is 446° C. Polymer density is 1.33 g/ml.

EXAMPLE 7 to Example 6, a TMA end-capped polymer was prepared from 7.09 g of oxybisaniline, 2.46 g of 3,5-diamino-t-butylbenzene, 10 g of trimellitic anhydride acid chloride, and 0.48 g of trimellitic anhydride in 50 ml of dimethylacetamide. The initial inherent viscosity of the polymer was 0.294; after curing 30 minutes at 500° F., the inherent viscosity was 0.538.

EXAMPLE 8

Some physical properties of the polyimides of this invention are given in the Table below.

TABLE

Physical Properties of Films and Wafer Level Coatings of Some DATB Polyimides and Copolyimides

| Dian-hydride | Dielectric Constant at 0% R.H. and 1MHz | Moisture Absorption (Wafer Level) (%) | % Increase in Dielectric Constant at 40% R.H. (Wafer Level) | Tg (°C.) | Temperature of Onset of Degradation in $N_2$ (°C.) |
|---|---|---|---|---|---|
| OPAN | 3.18 | 1.2 | — | 291 | 510 |
| IPAN | 2.99 | 1.9 | — | 309 | 473 |
| 6FDA | 2.77 | 0.7 | — | 310 | 486 |
| 6FDA[1] | 2.97 | 0.8 | 5.6 | 349 | 458 |
| 6FDA[2] | 3.07 | — | — | 296 | 467 |

[1]Copolymer of DATB and 4,4'-bis(p-aminophenoxy)biphenyl
[2]Copolymer of DATB and 4,4'-diaminodiphenylether

What is claimed is:

1. An at least partially soluble, film-forming, polyamide-imide or copolymer thereof, made from 3,5-diamino-t-butylbenzene.

2. An at least partially soluble, film-forming polyamide-imide or copolyamide-imide made from 3,5-diamino-t-butylbenzene and the acyl chloride derivative of trimellitic acid anhydride.

* * * * *

UNITED STATES PATENT OFFICE
CERTIFICATE OF CORRECTION

Patent No. 5,003,037                    Dated    March 26, 1991

Inventor(s)    David J. Fenoglio, Douglas E. Fjare, Edwin F. Morello, Neal B. Nowicki It is certified that error appears in the above-identified patent and that said Letters Patent is hereby corrected as shown below:

| Column | Line | |
|--------|------|---|
| 3 | 42 | "June 26" should read --June 28-- |
| 6 | 12 | "to Example" should read --In a manner similar to Example-- |

Signed and Sealed this

Fourth Day of August, 1992

Attest:

DOUGLAS B. COMER

Attesting Officer        Acting Commissioner of Patents and Trademarks

UNITED STATES PATENT OFFICE
CERTIFICATE OF CORRECTION

Patent No. 5,003,037　　　　　　　　　Dated　March 26, 1991

Inventor(s)　Douglas E. Fjare, Edwin F. Morello

It is certified that error appears in the above-identified patent and that said Letters Patent is hereby corrected as shown below:

On the title page,

[75]　Inventors: "David J. Fenoglio, Wheaton; Douglas E. Fjare; Edwin F. Morello, both of Naperville; Neal B. Nowicki, St. Charles, all of Ill."

should read

--Douglas E. Fjare; Edwin F. Morello, both of Naperville, Illinois.--

Signed and Sealed this

Twentieth Day of October, 1992

Attest:

DOUGLAS B. COMER

*Attesting Officer*　　　　*Acting Commissioner of Patents and Trademarks*